US010401942B2

(12) United States Patent
Bogue et al.

(10) Patent No.: US 10,401,942 B2
(45) Date of Patent: Sep. 3, 2019

(54) REFERENCE VOLTAGE SUB-SYSTEM ALLOWING FAST POWER UP FROM EXTENDED PERIODS OF ULTRA-LOW POWER STANDBY MODE

(71) Applicant: Ambiq Micro, Inc., Austin, TX (US)

(72) Inventors: Ivan Bogue, Austin, TX (US); Yanning Lu, Austin, TX (US); Bharath Mandyam, Austin, TX (US)

(73) Assignee: Ambiq Micro Inc., Austin, TX (US)

( * ) Notice: Subject to any disclaimer, the term of this patent is extended or adjusted under 35 U.S.C. 154(b) by 0 days.

(21) Appl. No.: 15/439,887

(22) Filed: Feb. 22, 2017

(65) Prior Publication Data

US 2018/0239415 A1    Aug. 23, 2018

(51) Int. Cl.
*G06F 1/3287* (2019.01)
*G05F 1/575* (2006.01)
*G06F 1/3296* (2019.01)

(52) U.S. Cl.
CPC .......... *G06F 1/3287* (2013.01); *G05F 1/575* (2013.01); *G06F 1/3296* (2013.01)

(58) Field of Classification Search
CPC .......... G06F 1/328; G06F 1/3296; G05F 3/02; G05F 3/08; G05F 3/20; G05F 3/24–262
See application file for complete search history.

(56) References Cited

U.S. PATENT DOCUMENTS

| | | | | |
|---|---|---|---|---|
| 5,998,978 A * | 12/1999 | Connell | ..... | G05F 1/56 323/273 |
| 6,239,652 B1 * | 5/2001 | Oh | ..... | G05F 1/465 323/316 |
| 6,842,068 B2 * | 1/2005 | Perrier | ..... | G05F 1/575 323/280 |
| 6,888,397 B2 * | 5/2005 | Tsuchiya | ..... | G01K 7/01 327/512 |
| 7,439,798 B2 * | 10/2008 | Kouno | ..... | G05F 1/56 327/541 |
| 7,688,667 B2 * | 3/2010 | Cha | ..... | G11C 5/14 327/540 |
| 8,384,470 B2 * | 2/2013 | Sugiura | ..... | G05F 3/242 327/541 |
| RE44,229 E * | 5/2013 | Horiguchi | ..... | G11C 5/147 365/189.04 |
| 2004/0124909 A1 * | 7/2004 | Haider | ..... | G05F 3/205 327/540 |
| 2004/0155636 A1 * | 8/2004 | Fukui | ..... | G05F 1/56 323/281 |
| 2008/0136396 A1 * | 6/2008 | Heilmann | ..... | G05F 1/56 323/298 |
| 2010/0156520 A1 * | 6/2010 | Kume | ..... | G05F 1/56 327/540 |

(Continued)

*Primary Examiner* — Thomas J. Hiltunen
(74) *Attorney, Agent, or Firm* — Artie Pennington; Hunt Pennington Kumar & Dula, PLLC (57) ABSTRACT

A reference voltage sub-system that allows fast power up after spending extended periods in an ultra-low power standby mode. The reference voltage sub-system includes a reference voltage buffer, a reference voltage keeper, an active calibration facility for selectively adjusting the reference voltage keeper output to match the reference voltage buffer output, and a selection means for selecting between the reference voltage buffer output and the reference voltage keeper output.

11 Claims, 6 Drawing Sheets

(56) References Cited

U.S. PATENT DOCUMENTS

2010/0315060 A1* 12/2010 Ikeda .................. G05F 3/08
323/314
2013/0147271 A1* 6/2013 Yotsuji ................ H02J 4/00
307/28
2016/0103459 A1* 4/2016 Chern .................. G05F 1/468
323/313

* cited by examiner

REFERENCE VOLTAGE SUB-SYSTEM ALLOWING FAST POWER UP FROM EXTENDED PERIODS OF ULTRA-LOW POWER STANDBY MODE

BACKGROUND OF THE INVENTION

1. Field of the Invention

The present invention relates to low power semiconductor memory circuits and methods. More specifically, the present invention relates to a reference voltage sub-system that allows fast power up after spending extended periods in an ultra-low power standby mode. The novel low reference voltage circuits and methods are suitable for use in low power microprocessors, microcontrollers, or power management devices.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice and not limiting to the scope of this disclosure.

Figure 1:
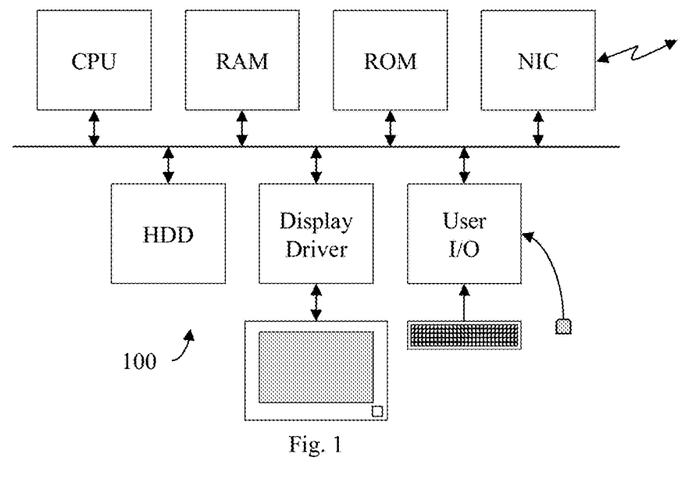
FIG. 1 illustrates, in block diagram form, a general-purpose computer system adapted to instantiate any of the several embodiments.
Figure 2:
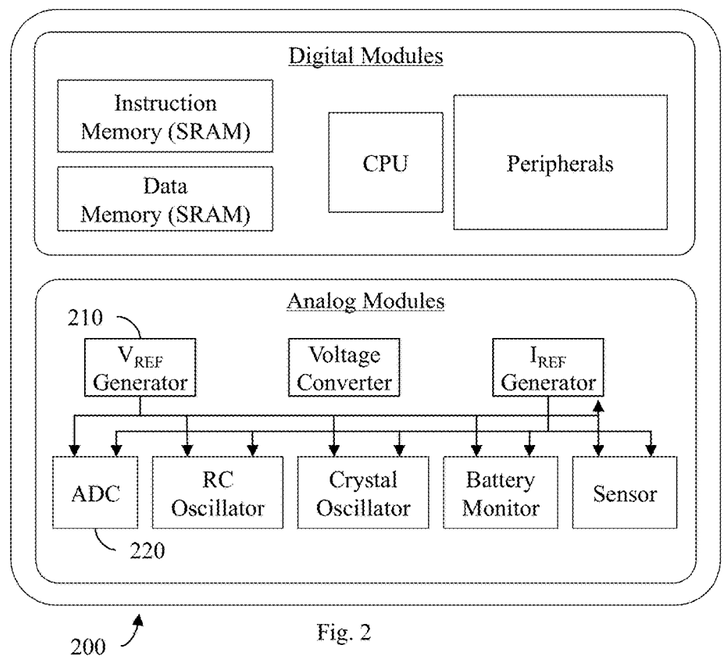
FIG. 2 illustrates, in block diagram form, a typical integrated system adapted to practice any of the several embodiments.

Shown in FIG. 1 is a typical general-purpose computer system 100. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones, tablets and the like, many of the discrete components typical of desktop or laptop devices illustrated in FIG. 1 are integrated into a single integrated circuit chip. Shown by way of example in FIG. 2 is a typical single-chip microcontroller unit ("MCU") 200 comprising: a central processing unit ("CPU"), at least one reference voltage generator ("VREF") facility 210, and at least one analog-to-digital converter ("ADC") facility 220.

ADCs continually consume power during operation. As a result, ICs employing ADCs generally exhibit relatively high power consumption as a result of current drain when in use. Power reduction techniques help reduce power consumption, those power reduction techniques including powering down the ADC and associated ADC control circuits and ADC reference circuits when the ADC is not in use, i.e., in sleep mode.

Figure 3:
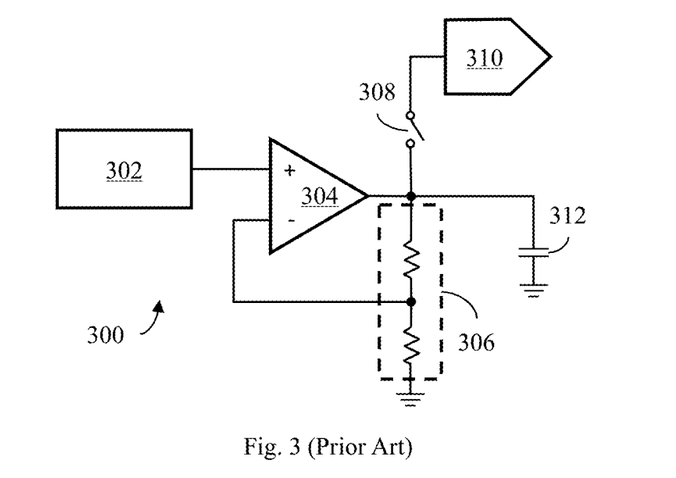
FIG. 3 illustrates, in schematic form, a conventional reference voltage facility.

FIG. 3 illustrates, in schematic form, a conventional reference voltage facility 300. Reference voltage facility 300 includes a VREF 302, reference buffer 304, feedback network 306, switch 308, ADC 310, reservoir capacitor 312. The VREF 302 may be a band-gap reference circuit, or any other suitable voltage reference circuit as would be understood by one of ordinary skill in the art. Reference buffer 304 is a conventional amplifier or buffer with the feedback network 306 determining the gain of the circuit as would be understood by one of ordinary skill in the art. Reference buffer 304 is adapted to receive a reference voltage from voltage reference generator 302 and to receive a feedback voltage from the feedback network 306. Reference buffer 304 outputs a stable reference voltage which is received by ADC 310 and reservoir capacitor 312.

During a sleep mode, or any other power reduction mode, reference buffer 304 is powered down using known techniques such as power gating. Powering down reference buffer 304 allows the top plate of capacitor 312 to float. As is known, excess leakage current will cause the stable reference voltage on the top plate of the capacitor to decrease over time. This reduction in voltage requires the reference buffer 304 to charge the stable reference voltage back to its pre-power down voltage level, thus delaying the conversion operations performed by the ADC 310.

Known systems have addressed the delay in restarting the ADC 310, utilizing capacitors along with sample and hold circuits and/or operations to maintain critical voltages such as the stable reference voltage required by ADC 310. However, these methods of maintaining a critical voltage has a finite time over which they are effective. Extended time spent in sleep mode or in a powered down mode results in the critical node voltages decreasing to a level that require an initial recharging of the critical node voltage, costing time and power consumption prior to achieving operation mode voltage levels.

In recent years, due to the growth of portable electronics, wearable technologies, and Internet of Things (IoT) technologies, there has been a push to lower the power consumption of devices. Additional time spent recharging the stable reference voltage to operable levels results in additional power draw by the system. What is needed is an apparatus or method where the stable reference voltage is held to a voltage during power down that is substantially the same as the voltage during operation.

BRIEF SUMMARY OF THE INVENTION

In one embodiment, in a reference voltage facility including a reference voltage buffer adapted to develop a first reference voltage, a reference voltage keeper adapted to develop a second reference voltage as a function of a trim control signal, an active calibration facility adapted to adjust said trim control signal to increase said second reference voltage if said second reference voltage is less than said first reference voltage, and adjust said trim control signal to decrease said second reference voltage if said second reference voltage is greater than said first reference voltage, and a first selector switch adapted to provide a selected one of said first and second reference voltages.

In another embodiment, a method of operating a reference voltage facility is disclosed comprising the steps of: (1) developing a first reference voltage; (2) developing a second reference voltage as a function of a trim control signal; and (3) comparing the first reference voltage to the second reference voltage, and: (3.1) if the second reference voltage is less than the first reference voltage, adjusting the trim control signal to increase the second reference voltage; and (3.2) if the second reference voltage is greater than the first reference voltage, adjusting the trim control signal to decrease the second reference voltage; and (4) providing a selected one of the first and second reference voltages.

In one other embodiment, a reference voltage facility is configured to perform the method of operating a reference voltage facility.

In yet another embodiment, a computing system is disclosed comprising a voltage reference facility configured to perform the method of operating a reference voltage facility.

In one further embodiment, a computer readable medium is provided including executable instructions which, when executed in a processing system, causes the processing system to perform the method of operating a reference voltage facility.

BRIEF DESCRIPTION OF THE SEVERAL VIEWS OF THE DRAWINGS

The several embodiments may be more fully understood by a description of certain exemplary embodiments in conjunction with the attached figures in which.

In the figures, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION

Figure 4:
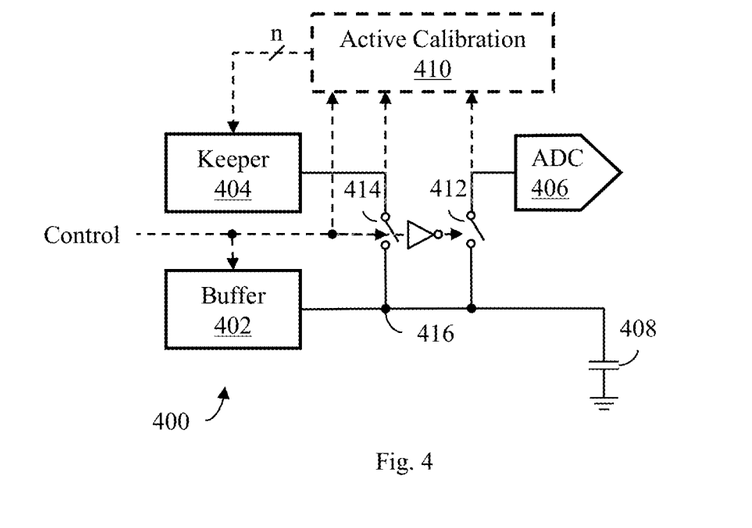
FIG. 4 illustrates, in schematic form, a reference voltage facility according to some embodiments.

FIG. 4 illustrates, in schematic form, a reference voltage facility 400 according to some embodiments. The reference voltage facility 400 includes a reference buffer ("buffer") 402, a keeper cell ("keeper") 404, an ADC 406, a reservoir capacitor 408, and an active calibration facility 410. The ADC 406 is representative of a typical functional block in a semiconductor device that uses a fixed (constant) voltage for the operation of the device, and may include without limitation analog-to-digital converters, power supplies, and digital-to-analog converters. In general, the reference voltage facility 400 operates in two modes: (i) an active mode, illustrated in FIG. 4A; and (ii) a low power mode, illustrated in FIG. 4B. Each mode is selected by a control signal, illustrated here as Control. The reference voltage facility 400 also includes two selector switches, switch 412 and 414. The position of switch 412 and the position of switch 414 reflect the operational mode of the reference voltage facility 400.

Figure 4A:
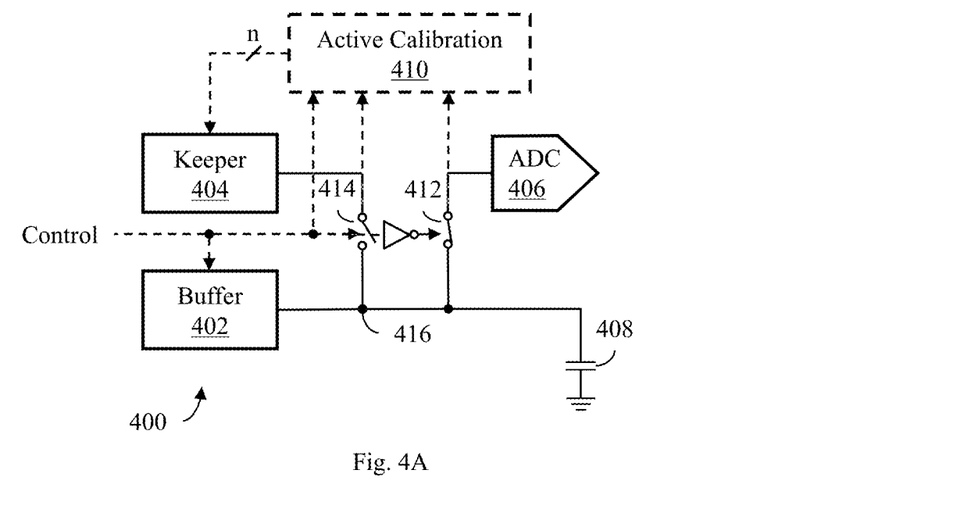
FIG. 4A illustrates, in schematic form, the reference voltage facility of FIG. 4 operating in active mode.

FIG. 4A illustrates, in schematic form, the reference voltage facility 400 of FIG. 4 operating in active mode. According to at least one embodiment, during operation of the reference voltage facility 400, the value of the Control signal is asserted, placing the reference voltage facility 400 in to active mode. During active mode, switch 412 is closed and switch 414 is open. Closing switch 412 operates to couple the ADC 406 and the active calibration facility 410 to the stable reference voltage provided by buffer 402 on node 416. Reservoir capacitor 408 is also coupled to node 416 and, as is understood, is operative to store the stable reference voltage on reference node 416 and to smooth or even out fluctuations in the stable reference voltage developed by buffer 402. The stable reference voltage on the reference node 416 is utilized by the ADC 406 during conversion operations. The active calibration facility 410 receives as input the stable reference voltage developed by buffer 402 and a keeper voltage developed by keeper 404. The active calibration facility 410 compares the stable reference voltage developed by buffer 402 to the output voltage of keeper 404 and provides a trim control code to keeper 404. According to this embodiment, the trim control code is a set of n-bit trim codes provided to the keeper 404 to adjust the output voltage developed by keeper 404.

By way of example, during active mode operation, if the stable reference voltage developed by buffer 402 is lower than the output voltage developed by keeper 404, the active calibration facility 410 outputs a set of n-bit trim control codes to decrease the output voltage developed by keeper 404. The keeper 404 responds to those n-bit trim control codes by decreasing the output voltage developed by keeper 404, thereby reducing the detected gap between the output voltage developed by the keeper 404 and the output voltage developed by buffer 402. The active calibration loop 410 then waits a period of time, i.e., on the order of milliseconds, and repeats the comparison operation and the adjustment operation. This adjustment cycle repeats until active calibration facility 410 detects a state where the output developed by buffer 402 is greater than the output voltage developed by the keeper 404. When the output voltage developed by keeper 404 falls below the output voltage developed by buffer 402, the active calibration facility 410 stores the then current codes for use during the low power mode. According to one embodiment, the wait times between cycles may be on the order of ten (10) milliseconds, and the output voltage developed by keeper 404 may be maintained between thirty (30) millivolts and five (5) millivolts below the voltage output developed by the buffer 402. By keeping the two voltages substantially similar to each other, the reference voltage facility 400 may be switched between modes quickly without the need to wait on the stable reference voltage on node 416 to stabilize when switching between modes.

Likewise, and by way of example, if the stable reference voltage developed by buffer 402 is greater than the output voltage developed by keeper 404, the active calibration facility 410 outputs a set of n-bit trim control codes to increase the output voltage developed by keeper 404. The keeper 404 responds to those n-bit trim control codes by increasing the output voltage developed by keeper 404, thereby reducing the detected gap between the output voltage developed by the keeper 404 and the output voltage developed by buffer 402. The active calibration loop 410 then waits a period of time, and repeats the comparison operation and the adjustment operation until the output developed by buffer 402 is lower than the output voltage developed by the keeper 404. When the output voltage developed by keeper 404 rises above the output voltage developed by buffer 402, the active calibration facility 410 stores the immediately prior codes for use during the low power mode.

Figure 4B:
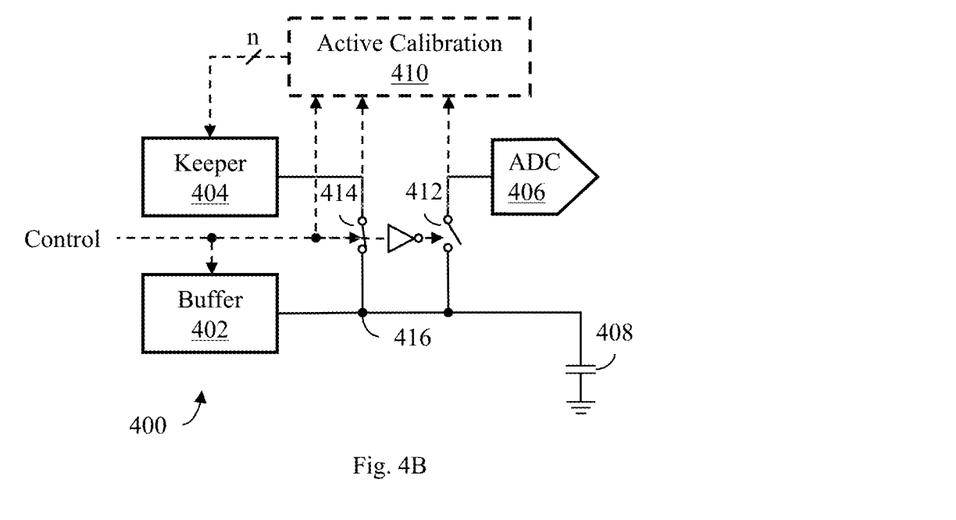
FIG. 4B illustrates, in schematic form, the reference voltage facility of FIG. 4 operating in low power mode.

FIG. 4B illustrates, in schematic form, the reference voltage facility 400 of FIG. 4 operating in low power mode. During operation, the value of the control signal is de-asserted, placing the reference voltage facility 400 in to low power mode. During low power mode, switch 412 is open and switch 414 is closed. Closing switch 414 operates to couple the keeper 404 to node 416. De-asserting the control signal places the buffer 402 in low power mode, allowing its output to float. De-asserting Control may also place the ADC 406 in low power mode. While in low power mode, the active calibration facility 410 outputs the stored n-bit trim codes to keeper 404. The keeper 404 outputs a stable reference voltage in response to the n-bit trim codes provided by active calibration facility 410. This output voltage developed by keeper 404 operates to maintain the stable reference voltage on node 416 and capacitor 408 at, or near, the voltage level desired for a near immediate conversion by the ADC 406 upon switching back to active mode. By way of example, the output voltage developed by keeper 404 may be maintained between thirty (30) millivolts and five (5) millivolts below the voltage output developed by the buffer 402.

Figure 4C:
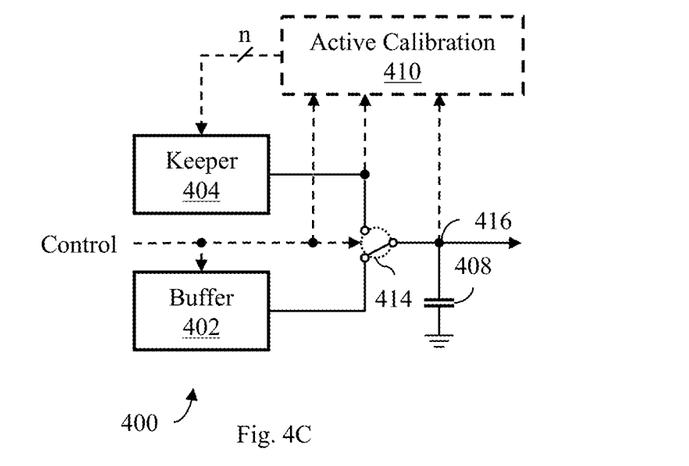
FIG. 4C illustrates, in schematic form, another embodiment of the reference voltage facility of FIG. 4 operating in active mode.

FIG. 4C illustrates, in schematic form, another embodiment of the reference voltage facility 400 of FIG. 4 operating in active mode. According to this embodiment, reference voltage facility 400 includes the buffer 402, the keeper 404, reservoir capacitor 408 and active calibration facility 410. Switch 412 and switch 414 have been replaced by a single switch 414. As is understood, the switch 414 may be a simple 2-1 mux or any other analogous circuit. The state of switch 414 is controlled by the control input Control.

During operation, the value of the Control signal is asserted, placing the reference voltage facility 400 in to active mode. During active mode, switch 414 operates to couple the stable reference voltage provided by buffer 402 to the reservoir capacitor 408 and to a functional block in a semiconductor device that uses a fixed (constant) voltage for the operation of the device, i.e., the ADC 406 of FIG. 4. The active calibration facility 410 receives as input the stable reference voltage developed by buffer 402 and a keeper voltage developed by keeper 404. The active calibration facility 410 compares the stable reference voltage developed by buffer 402 to the output voltage of keeper 404 and provides a trim control code to keeper 404, as previously discussed.

Figure 4D:
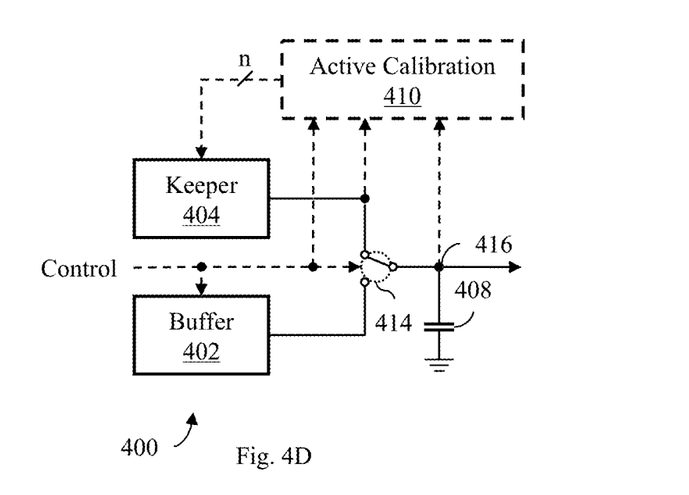
FIG. 4D illustrates, in schematic form, the embodiment of the reference voltage facility of FIG. 4 operating in low power mode.

FIG. 4D illustrates, in schematic form, the embodiment of the reference voltage facility 400 of FIG. 4C operating in low power mode. During low power mode, switch 414 operates to couple the stable reference voltage provided by keeper 404 to node 416 and the reservoir capacitor 408. During operation, the value of the Control signal is de-asserted, placing the reference voltage facility 400 in to low power mode. De-asserting Control places the buffer 402 in low power mode, allowing its output to float. De-asserting Control may also place the ADC 406 in low power mode. While in low power mode, the active calibration facility 410 outputs the stored n-bit trim codes to keeper 404. The keeper 404 outputs a stable reference voltage in response to the n-bit trim codes provided by active calibration facility 410. This output voltage developed by keeper 404 operates to maintain the stable reference voltage on node 416 and capacitor 408 at, or near, the voltage level desired.

Figure 5:
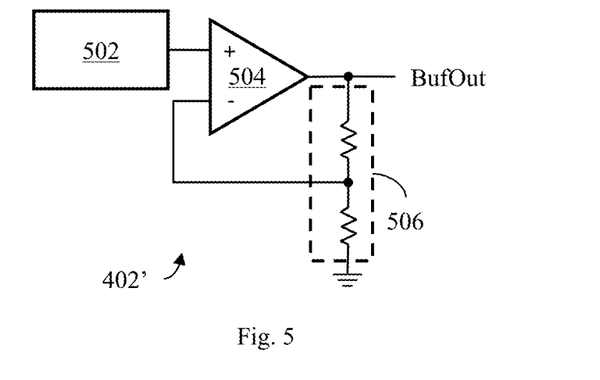
FIG. 5 illustrates, in schematic form, one reference buffer embodiment adapted for use in the reference voltage facility of FIG. 4, FIG. 4A, FIG. 4B, FIG. 4C, and FIG. 4D

FIG. 5 illustrates, in schematic form, one reference buffer 402' adapted for use in the reference voltage facility 400 of FIG. 4 according to one embodiment. The buffer 402' comprises a VREF 502 and reference buffer 504. VREF 502 is adapted to develop a reference voltage and may be a band-gap reference circuit, a 2-transistor voltage reference generator, or any other suitable voltage reference circuit as would be understood by one of ordinary skill in the art. One suitable 2-transistor voltage reference generator is described in U.S. application Ser. No. 12/823,160, filed on 25 Jun. 2010, now U.S. Pat. No. 8,564,275, which is hereby incorporated by reference in its entirety as if fully set forth herein. Buffer 402' also includes a reference buffer 504 and feedback network 506. Reference buffer 504 is a conventional amplifier or buffer with the feedback network 506 determining the gain of the circuit, as would be understood by one of ordinary skill in the art. Reference buffer 504 is adapted to receive a reference voltage from VREF 502, to receive a feedback voltage from the feedback network 506, and is adapted to output a stable reference voltage ("BufOut").

Figure 6:
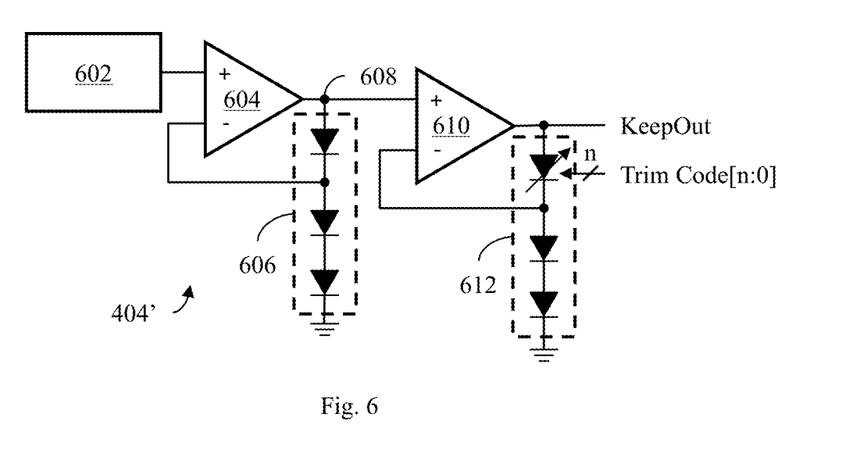
FIG. 6 illustrates, in schematic form, one keeper cell embodiment adapted for use in the reference voltage facility of FIG. 4, FIG. 4A, FIG. 4B, FIG. 4C, and FIG. 4D.

FIG. 6 illustrates, in schematic form, one keeper cell 404' adapted for use in the reference voltage facility 400 of FIG. 4. The keeper cell 404' comprises a second VREF 602. VREF 602 is adapted to develop a second reference voltage and may be a band-gap reference circuit, a 2-transistor voltage reference generator, or any other suitable voltage reference circuit as would be understood by one of ordinary skill in the art. The keeper cell 404' also includes a reference buffer 604 and feedback network 606. Reference buffer 604 is a conventional amplifier or buffer with the feedback network 606 determining the gain of the circuit as would be understood by one of ordinary skill in the art. Reference buffer 604 is adapted to receive a reference voltage from VREF 602, to receive a feedback voltage from the feedback network 606, and is adapted to output a stable reference voltage 608. The keeper cell 404' also include a second reference buffer 610 and feedback network 612. Reference buffer 610 is a conventional amplifier or buffer with the feedback network 612 determining the gain of the circuit as would be understood by one of ordinary skill in the art. Reference buffer 610 is adapted to receive the stable reference voltage 608 developed by reference buffer 604, to receive a feedback voltage from the feedback network 612, and is adapted to output a stable reference voltage 608. The feedback network 612 is a tunable divider network such as those described in U.S. application Ser. No. 14/918,384, filed 20 Oct. 2015, which is hereby incorporated by reference in its entirety as if fully set forth herein. The feedback network 612 is adapted to adjust the divided voltage generated by the feedback network 612 in response to the received set of n-bit trim codes, illustrated in FIG. 6 as "Trim Code[n:0]", adjusting the gain of reference buffer 610 and, concomitantly, the output voltage, here labeled "KeepOut".

Figure 7:
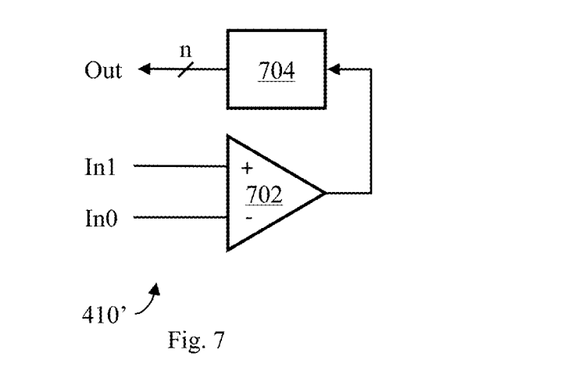
FIG. 7 illustrates, in schematic form, one active calibration facility embodiment adapted for use in the reference voltage facility of FIG. 4, FIG. 4A, FIG. 4B, FIG. 4C, and FIG. 4D.
Figure 8:
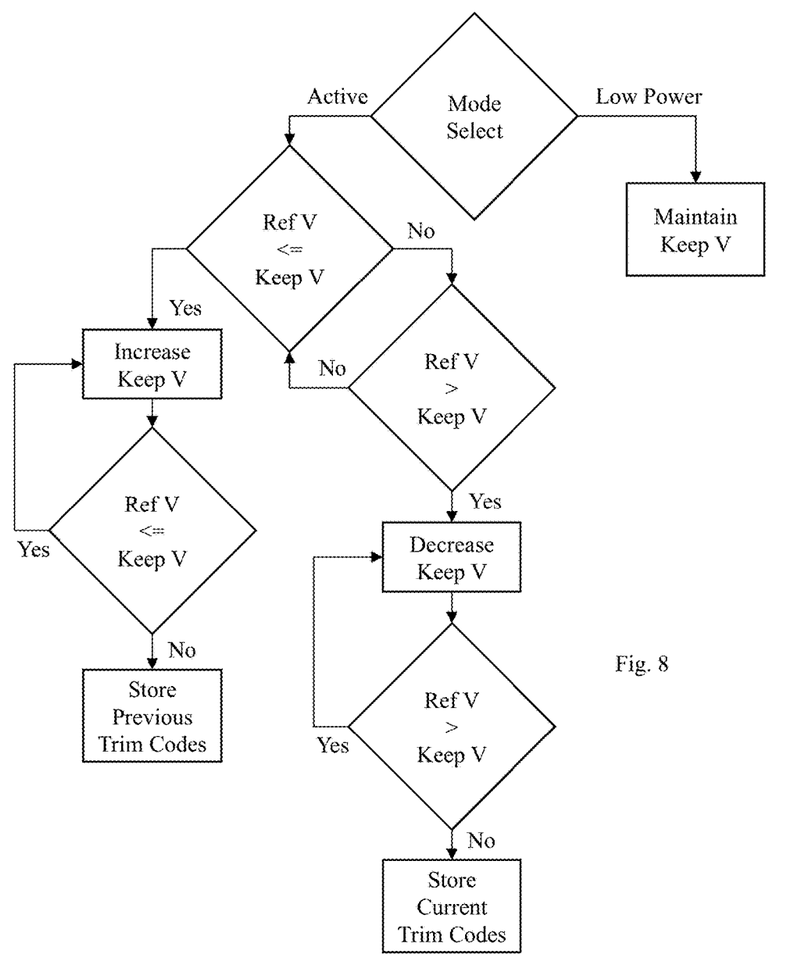
FIG. 8 illustrates, in flow chart form, one software implementation of the active calibration facility embodied in the reference voltage facility of FIG. 4, FIG. 4A, FIG. 4B, FIG. 4C, and FIG. 4D.

FIG. 7 illustrates, in schematic form, one embodiment of active calibration facility 410' adapted for use in the reference voltage facility 400 of FIG. 4. The active calibration facility 410' includes a comparator 702 adapted to detect a difference between input In1 and input In0. During operation, comparator 702 performs a comparison of the voltage on input In1 and the voltage on input In2; and provides a logic_1 value when the voltage on input In1 is higher than the voltage on input In0, and a logic_0 value when the voltage on input In1 is lower than the voltage on input In0. The active calibration facility 410' also includes a state machine 704. The state machine 704 is adapted to receive the output developed by comparator 702 and to develop the set of n-bit trim codes as a function of the received output developed by comparator 702. Referring back to FIG. 4, when reference voltage facility 400 is in active mode, the active calibration facility 410' compares the stable reference voltage developed by buffer 402 with output voltage developed by keeper 410 and adjust the set of n-bit trim codes accordingly. If the stable reference voltage developed by buffer 402 is less than the output voltage developed by keeper 404, the active calibration facility 410 outputs a set of n-bit trim control codes which causes the keeper 404 to decrease the output voltage developed by keeper 404 so that the voltage level is closer to the output voltage developed by buffer 402. The active calibration loop 410' then waits a period of time, i.e., on the order of milliseconds, and repeats the comparison operation and the adjustment operation until the output developed by buffer 402 is more than the output voltage developed by the keeper 404. When the output voltage developed by keeper 404 falls below the output voltage developed by buffer 402, the active calibration facility 410, the then current codes are stored by the active calibration facility 410 for use during the low power mode. When the reference voltage facility 400 is in low power mode, the active calibration facility holds the trim codes constant. According to one embodiment, the active calibration facility may be implemented in software running on the system as illustrated in the follow chart of FIG. 8.

Although described in the context of particular embodiments, one of ordinary skill in this art will readily realize that many modifications may be made in such embodiments to adapt either to specific implementations.

Thus it is apparent that a technique where the stable reference voltage is held to a voltage during power down that is substantially the same as the voltage during operation is disclosed. Further, we submit that our method and apparatus provides performance generally superior to the best prior art techniques.

What is claimed is:

1. A reference voltage facility comprising:
   said reference voltage facility operable in a first mode which is active mode, said reference voltage facility operable in a second mode which is standby mode;
   a reference voltage buffer adapted to develop a first reference voltage;
   a reference voltage keeper adapted to develop a second reference voltage as a function of a trim control signal, said trim control signal comprising a set of n-bit trim codes;
   an active calibration facility adapted to:
   in said first mode, by a comparator, comparing said first reference voltage with said second reference voltage, and:
   when said first reference voltage exceeds said second reference voltage, said
   comparator providing comparator output comprising a first logic value,
   when said first reference voltage is less than said second reference voltage, said
   comparator providing comparator output comprising a second logic value;
   in said first mode, by a state machine, receive said comparator output;
   in said first mode, by said state machine, develop said set of n-bit trim codes as a function of said comparator output;
   in said first mode, by said comparator, repeat said comparing until said second reference voltage is less than said first reference voltage;
   in said first mode, by said state machine, adjust said set of n-bit trim codes upon said repeat, as follows:
   if said second reference voltage is less than said first reference voltage, adjust said set of n-bit trim codes to cause a keeper receiving said set of n-bit trim codes to increase said second reference voltage;
   if said second reference voltage is greater than said first reference voltage, adjust said set of n-bit trim codes to cause a keeper receiving said set of n-bit trim codes to decrease said second reference voltage;
   in said first mode, if said second reference voltage is less than said first reference voltage, store said set of n-bit trim codes for use in said second mode;
   in said second mode, said state machine holding constant said set of n-bit trim codes at values last stored in said first mode;
   a first selector switch adapted to provide a selected one of said first and second reference voltages; and
   a reservoir capacitor adapted to:
   receive said selected one of said first and second reference voltages; and
   operate to:
   store said selected one of said first and second reference voltages; and
   smooth fluctuations in said selected one of said first and second reference voltages.

2. The reference voltage facility of claim 1 comprising:
   said keeper comprising a feedback network, said feedback network comprising a tunable divider network, said tunable divider network trimmed as a function of said set of n-bit trim codes.

3. The reference voltage facility of claim 2 comprising:
   said tunable divider network comprising an adjustable resistive element, said adjustable resistive element trimmed as a function of said set of n-bit trim codes.

4. The reference voltage facility of claim 1 wherein said first reference voltage and said second reference voltage are different by between 5 mV and 30 mV.

5. A method of operating a reference voltage facility, said reference voltage facility operable in a first mode which is active mode, said reference voltage facility operable in a second mode which is standby mode, said method comprising the steps of:
- developing, by a reference voltage buffer, a first reference voltage;
- developing, by a reference voltage keeper, a second reference voltage as a function of a trim control signal, said trim control signal comprising a set of n-bit trim codes;
- in an active calibration facility:
  - in said first mode:
    - comparing, by a comparator, said first reference voltage to the second reference voltage;
    - providing, by said comparator, when said first reference voltage exceeds said second reference voltage, comparator output comprising a first logic value,
    - providing, by said comparator, when said first reference voltage is less than said second reference voltage, comparator output comprising a second logic value;
    - receiving, by a state machine, said comparator output;
    - developing, by said state machine, said set of n-bit trim codes as a function of said comparator output;
    - repeating, by said comparator, said comparing until said second reference voltage is less than said first reference voltage;
    - adjusting, by said state machine, said set of n-bit trim codes upon said repeating, as follows:
      - if said second reference voltage is less than said first reference voltage, adjusting said set of n-bit trim codes to cause a keeper receiving said set of n-bit trim codes to increase the second reference voltage; and
      - if said second reference voltage is greater than said first reference voltage, adjusting said set of n-bit trim codes to cause a keeper receiving said set of n-bit trim codes to decrease the second reference voltage;
    - storing, if said second reference voltage is less than said first reference voltage, said set of n-bit trim codes for use in said second mode;
  - in said second mode:
    - holding constant, by said state machine, said set of n-bit trim codes at values last stored in said first mode;
- providing a selected one of the first and second reference voltages;
- storing said selected one of the first and second reference voltages; and
- smoothing said selected one of the first and second reference voltages.

6. The method of claim 5 comprising:
said adjusting comprising:
said keeper comprising a feedback network, said feedback network comprising a tunable divider network, said tunable divider network trimmed as a function of said set of n-bit trim codes.

7. The method of claim 6 comprising:
said tunable divider network comprising an adjustable resistive element, said adjustable resistive element trimmed as a function of said set of n-bit trim codes.

8. The method of claim 5 wherein said first reference voltage and said second reference voltage are different by between 5 mV and 30 mV.

9. A reference voltage facility configured to perform the steps of a method according to any one of claims 5 to 8.

10. A computing system comprising a voltage reference facility according to claim 9.

11. A non-transitory computer readable medium including executable instructions which, when executed in a processing system, causes the processing system to perform the steps of a method according to any one of claims 5 to 8.

\* \* \* \* \*